United States Patent
Niwa et al.

(10) Patent No.: US 11,692,893 B2
(45) Date of Patent: Jul. 4, 2023

(54) PRESSURE SENSOR INCLUDING SIDE-WALL PORTION INCLUDING SHIELD ELECTRODE

(71) Applicant: Murata Manufacturing Co., Ltd., Nagaokakyo (JP)

(72) Inventors: Ryosuke Niwa, Nagaokakyo (JP); Koichi Yoshida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 157 days.

(21) Appl. No.: 17/399,228

(22) Filed: Aug. 11, 2021

(65) Prior Publication Data

US 2021/0372876 A1   Dec. 2, 2021

Related U.S. Application Data

(63) Continuation of application No. PCT/JP2020/008127, filed on Feb. 27, 2020.

(30) Foreign Application Priority Data

Mar. 13, 2019   (JP) .............................. JP2019-045963

(51) Int. Cl.
*G01L 9/00*   (2006.01)
(52) U.S. Cl.
CPC .................................. *G01L 9/0073* (2013.01)
(58) Field of Classification Search
None
See application file for complete search history.

(56) References Cited

U.S. PATENT DOCUMENTS

| | | | | |
|---|---|---|---|---|
| 2005/0262947 | A1* | 12/2005 | Dehe | H04R 19/00 |
| | | | | 73/754 |
| 2007/0194395 | A1* | 8/2007 | Hoshino | G01D 5/24 |
| | | | | 257/414 |
| 2007/0286438 | A1* | 12/2007 | Hirade | H04R 19/04 |
| | | | | 381/174 |

(Continued)

FOREIGN PATENT DOCUMENTS

| | | |
|---|---|---|
| CN | 105917205 A | 8/2016 |
| JP | 2005-227182 A | 8/2005 |

(Continued)

OTHER PUBLICATIONS

Official Communication issued in International Patent Application No. PCT/JP2020/008127, dated Mar. 24, 2020.

(Continued)

*Primary Examiner* — Brandi N Hopkins
*Assistant Examiner* — Nigel H Plumb
(74) *Attorney, Agent, or Firm* — Keating & Bennett, LLP

(57) ABSTRACT

A pressure sensor includes a base substrate, a first insulating layer at the base substrate, a stationary electrode at the first insulating layer, a side-wall portion around the stationary electrode at the first insulating layer, and a membrane having electrical conductivity, facing the stationary electrode across a space, and supported by the side-wall portion. The side-wall portion includes a shield electrode on the first insulating layer and a second insulating layer on the shield electrode. A distance between the stationary electrode and the membrane is less than a distance between the shield electrode and the membrane.

12 Claims, 5 Drawing Sheets

(56) References Cited

U.S. PATENT DOCUMENTS

| | | | |
|---|---|---|---|
| 2014/0151822 A1 | 6/2014 | Graham et al. | |
| 2014/0352446 A1* | 12/2014 | Kuisma | G01L 19/0654 |
| | | | 73/715 |
| 2015/0204744 A1* | 7/2015 | Kuisma | G01L 9/0041 |
| | | | 73/718 |
| 2017/0315008 A1* | 11/2017 | Tei | G01L 13/025 |

FOREIGN PATENT DOCUMENTS

| | | |
|---|---|---|
| JP | 2007-295516 A | 11/2007 |
| JP | 2016-526170 A | 9/2016 |
| JP | 2017-506329 A | 3/2017 |

OTHER PUBLICATIONS

First Office Action in CN202080019947.0, dated Nov. 8, 2022, 7 pages.

\* cited by examiner

PRESSURE SENSOR INCLUDING SIDE-WALL PORTION INCLUDING SHIELD ELECTRODE

CROSS REFERENCE TO RELATED APPLICATIONS

This application claims the benefit of priority to Japanese Patent Application No. 2019-045963 filed on Mar. 13, 2019 and is a Continuation Application of PCT Application No. PCT/JP2020/008127 filed on Feb. 27, 2020. The entire contents of each application are hereby incorporated herein by reference.

BACKGROUND OF THE INVENTION

1. Field of the Invention

The present invention relates to a pressure sensor for measuring pressure, such as air pressure.

2. Description of the Related Art

As described in, for example, Japanese Unexamined Patent Application Publication No. 2017-506329, a capacitance pressure sensor includes a planar base (base substrate), an insulating layer provided at the substrate, an inner electrode layer (stationary electrode) provided at the insulating layer, a frame-shaped side-wall portion provided around the stationary electrode at the insulating layer, and a diaphragm plate (membrane) facing the stationary electrode across a space. The side-wall portion supports the membrane. The pressure on the membrane is detected (calculated) in accordance with the electrostatic capacitance between the membrane and the stationary electrode.

In the capacitance pressure sensor described in Japanese Unexamined Patent Application Publication No. 2017-506329, the side-wall portion includes a shield electrode provided at the insulating layer and an insulating layer provided toward the membrane at the shield electrode. This shield electrode reduces effects of the electrostatic capacitance (parasitic capacitance) of the side-wall portion. As a result, the sensor sensitivity is improved, and additionally, the linearity of changes in electrostatic capacitance corresponding to changes in pressure is improved.

However, in the case of the capacitance pressure sensor described in Japanese Unexamined Patent Application Publication No. 2017-506329, the drive current supplied to the sensor to drive the sensor flows to the electrostatic capacitance between the stationary electrode and the membrane and also to the electrostatic capacitance between the shield electrode and the membrane. This means that a portion of the electric power supplied to the pressure sensor is consumed without being used for sensing.

One conceivable solution to this problem is to reduce the electrostatic capacitance between the shield electrode and the membrane by thickening the insulating layer at the side-wall portion to elongate the distance between the shield electrode and the membrane. However, in the capacitance sensor described in Japanese Unexamined Patent Application Publication No. 2017-506329, the distance between the shield electrode and the membrane is the same as the distance between the stationary electrode and the membrane. Thus, thickening the insulating layer at the side-wall portion increases the distance between the stationary electrode and the membrane. As a result, the electrostatic capacitance between the stationary electrode and the membrane is decreased, which decreases the sensor sensitivity.

SUMMARY OF THE INVENTION

Preferred embodiments of the present invention provide capacitance pressure sensors that each include a side-wall portion supporting a membrane and including a shield electrode and that are each able to reduce electric power consumed by the electrostatic capacitance between the shield electrode and the membrane without degrading the sensor sensitivity.

A pressure sensor according to a preferred embodiment of the present invention includes a base substrate, a first insulating layer at the base substrate, a stationary electrode at the first insulating layer, a side-wall portion around the stationary electrode at the first insulating layer, and a membrane having electrical conductivity, facing the stationary electrode across a space, and being supported by the side-wall portion. The side-wall portion includes a shield electrode on the first insulating layer and a second insulating layer on the shield electrode. The distance between the stationary electrode and the membrane is less than the distance between the shield electrode and the membrane.

According to preferred embodiments of the present invention, capacitance pressure sensors each including a side-wall portion that supports a membrane and a shield electrode are each able to reduce electric power consumed by the electrostatic capacitance between the shield electrode and the membrane without degrading the sensor sensitivity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A pressure sensor according to a preferred embodiment of the present invention includes a base substrate, a first insulating layer provided at the base substrate, a stationary electrode provided at the first insulating layer, a side-wall portion provided around the stationary electrode at the first insulating layer, and a membrane having electrical conductivity, facing the stationary electrode across a space, and being supported by the side-wall portion. The side-wall portion includes a shield electrode disposed on the first insulating layer and a second insulating layer disposed on the shield electrode. The distance between the stationary electrode and the membrane is less than the distance between the shield electrode and the membrane.

According to the present preferred embodiment, a capacitance pressure sensor including a side-wall portion that supports a membrane and includes a shield electrode is able to reduce electric power consumed by the electrostatic capacitance between the shield electrode and the membrane without degrading the sensor sensitivity.

For example, a surface of the membrane toward the base substrate may have a multi-tier structure including at least a first tier facing the stationary electrode and a second tier supported by the side-wall portion and provided around the first tier when viewed in a direction in which the stationary electrode and the membrane face each other. The second tier may be farther from the base substrate than the first tier.

For example, the side-wall portion may have a rectangular or substantially rectangular frame outer shape including a longitudinal direction and a transverse direction when viewed in the direction in which the stationary electrode and the membrane face each other. The first tier of the membrane may have a shape narrowed in at least one of the longitudinal direction and the transverse direction when viewed in the direction in which the stationary electrode and the membrane face each other. When both end portions of the membrane in the longitudinal direction are maintained in a deformed state because external force, such as compressive force, for example, is continuously applied to the pressure sensor, this structure can reduce or prevent deformation of the first tier facing the stationary electrode.

For example, at least a middle portion of the stationary electrode may be thicker than the shield electrode.

For example, a dielectric layer may be provided on a surface of the stationary electrode facing the membrane. With this structure, the pressure sensor can be used as a touch mode pressure sensor.

Hereinafter, preferred embodiments of the present invention will be described with reference to the drawings.

First Preferred Embodiment

Figure 1:
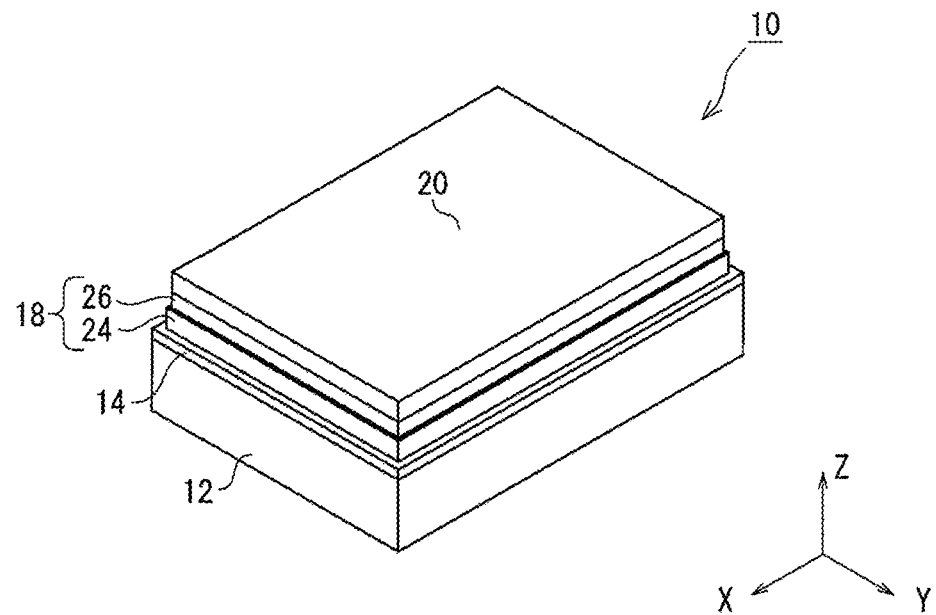
FIG. 1 is a perspective view of a pressure sensor according to a first preferred embodiment of the present invention.
Figure 2:
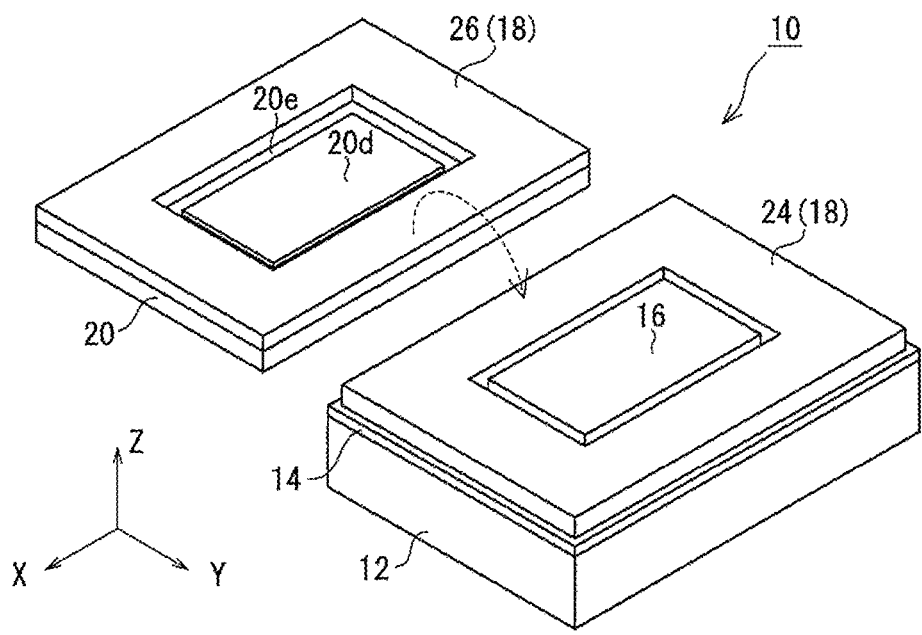
FIG. 2 is an exploded perspective view of the pressure sensor according to the first preferred embodiment of the present invention.
Figure 3:
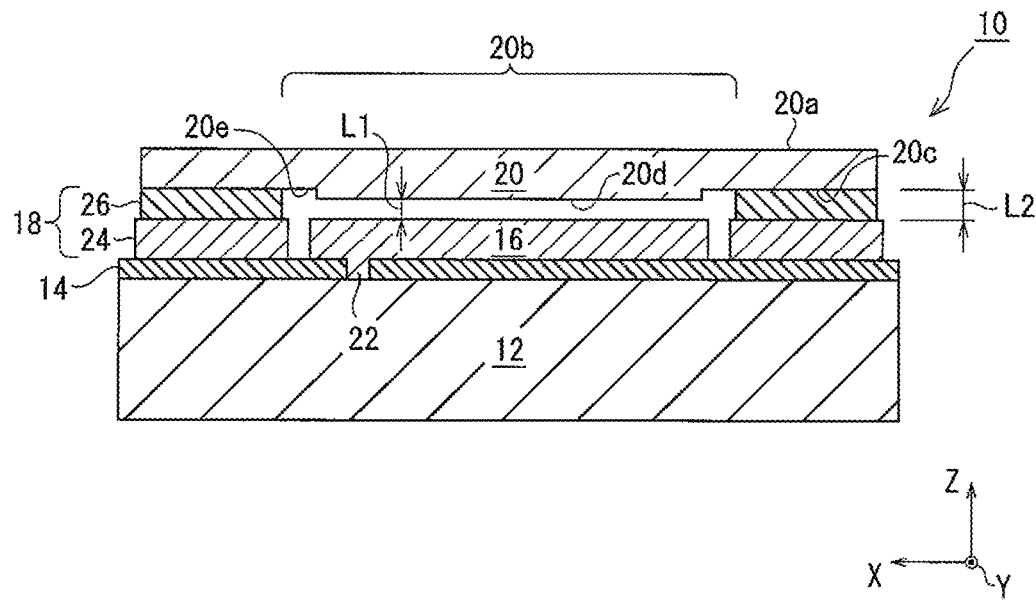
FIG. 3 is a sectional view of the pressure sensor according to the first preferred embodiment of the present invention.

FIG. 1 is a perspective view of a pressure sensor according to the first preferred embodiment of the present invention. FIG. 2 is an exploded perspective view of the pressure sensor. FIG. 3 is a sectional view of the pressure sensor. The X-Y-Z orthogonal coordinate system illustrated in the drawings is used for ease of understanding the present invention, and the X-Y-Z orthogonal coordinate system does not limit the present invention.

As illustrated in FIGS. 1 to 3, a pressure sensor 10 according to the first preferred embodiment, which is a capacitance pressure sensor, for example, includes a base substrate 12, a first insulating layer 14 provided at the base substrate 12, a stationary electrode 16 provided at the first insulating layer 14, a frame-shaped side-wall portion 18 provided around the stationary electrode 16 at the first insulating layer 14, and a membrane 20 supported by the side-wall portion 18.

The base substrate 12 is made of an insulating material and includes, for example, a conductor pattern and an external connection terminal (not illustrated in the drawings). In the first preferred embodiment, the base substrate 12 is a silicon substrate, for example.

The first insulating layer 14 is made of an insulating material and provided at the base substrate 12 to cover a surface of the base substrate 12 toward the membrane 20. In the first preferred embodiment, the first insulating layer 14 is, for example, a silicon oxide ($SiO_2$) film made by subjecting the surface of the base substrate 12, which is a silicon substrate, to a thermal oxidation process.

The stationary electrode 16 is made of an electrically conductive material and provided at the first insulating layer 14. In the case of the first preferred embodiment, the stationary electrode 16 is made of conductive polysilicon, for example. The stationary electrode 16 is electrically coupled to the conductor pattern at the base substrate 12 via a via-conductor 22 extending through the first insulating layer 14.

The side-wall portion 18 is a frame-shaped member provided at the first insulating layer 14. When viewed in a direction (Z-axis direction) in which the stationary electrode 16 and the membrane 20 face each other, the side-wall portion 18 is provided around the stationary electrode 16 at the first insulating layer 14. A space is provided between the side-wall portion 18 and the stationary electrode 16. In the case of the first preferred embodiment, when viewed in the direction in which the stationary electrode 16 and the membrane 20 face each other, the side-wall portion 18 has a rectangular or substantially rectangular outer shape.

The side-wall portion 18 supports the membrane 20 such that the stationary electrode 16 and the membrane 20 face each other across a space. This means that the thickness of the side-wall portion 18 from the first insulating layer 14 is greater than the thickness of the stationary electrode 16.

The membrane 20 is a thin plate-shaped member made of an electrically conductive material and having flexibility. In the case of the first preferred embodiment, the membrane 20 is made of conductive silicon, for example. The membrane 20 includes a pressure receiving surface 20a on which the pressure targeted for sensing acts. The pressure acting on the pressure receiving surface 20a displaces a diaphragm portion 20b, which is a portion of the membrane 20 and not supported by the side-wall portion 18, toward the stationary electrode 16.

The side-wall portion 18 includes a shield electrode 24 and a second insulating layer 26.

The shield electrode 24 is disposed on the first insulating layer 14. The shield electrode 24 is a frame-shaped electrode made of an electrically conductive material. In the case of the first preferred embodiment, the shield electrode 24 is made of conductive polysilicon, for example, in the same or substantially the same manner as the stationary electrode 16.

In the case of the first preferred embodiment, the shield electrode 24 is made by the same process as the process of the stationary electrode 16. Specifically, a polysilicon film, for example, is formed over the entire or substantially the entire first insulating layer 14. An annular groove is then etched at the polysilicon film. As a result, the polysilicon film is formed into the stationary electrode 16 and the shield electrode 24 surrounding the stationary electrode 16. Thus, the thickness of the stationary electrode 16 is the same or substantially the same as the thickness of the shield electrode 24. The function of the shield electrode 24 will be described later.

The second insulating layer 26 is disposed on the shield electrode 24. The second insulating layer 26 supports the membrane 20. The second insulating layer 26 is made of an insulating material. In the first preferred embodiment, the second insulating layer 26 is a silicon oxide ($SiO_2$) film, for example, formed by subjecting the membrane 20 made of conductive silicon to a thermal oxidation process.

In the first preferred embodiment, as illustrated in FIG. 2, the membrane 20 with the second insulating layer 26 is joined to the base substrate 12 with the first insulating layer 14, the stationary electrode 16, and the shield electrode 24, such that the pressure sensor 10 is fabricated. These portions are joined together by, for example, fusion bonding.

Figure 4:
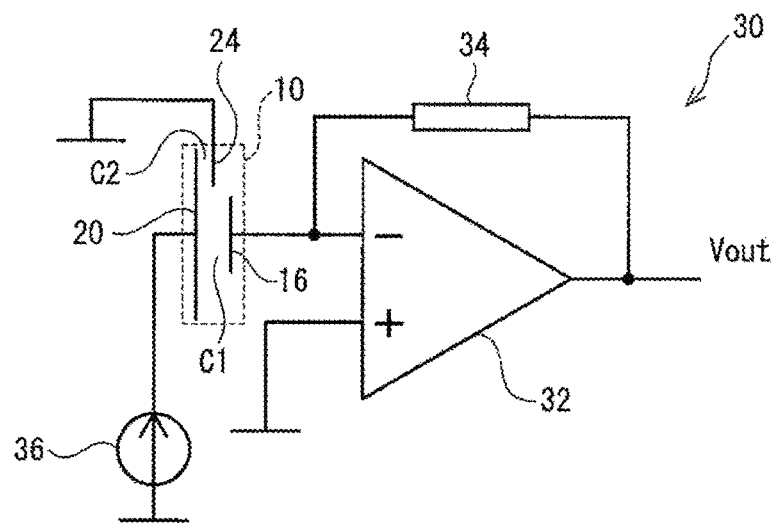
FIG. 4 illustrates an example of a connection of the pressure sensor and an inverting amplifier circuit.

FIG. 4 illustrates an example of a connection of a pressure sensor and an inverting amplifier circuit.

As illustrated in FIG. 4 as an example, the pressure sensor 10 is used with, for example, an inverting amplifier circuit 30 coupled to the pressure sensor 10. Specifically, the inverting amplifier circuit 30 includes an amplifier 32 and a feedback circuit 34. The stationary electrode 16 is coupled to an inverting input terminal of the amplifier 32. The feedback circuit 34 may be, for example, a resistor having a particular impedance. The membrane 20 is coupled to a power supply 36. A non-inverting input terminal of the amplifier 32 and the shield electrode 24 are grounded.

With this circuit configuration, the inverting amplifier circuit 30 outputs a voltage Vout that corresponds to the pressure acting on the pressure receiving surface 20a of the membrane 20, in other words, the distance between the stationary electrode 16 and the membrane 20. When the pressure acting on the pressure receiving surface 20a is changed, the distance between the stationary electrode 16 and the membrane 20 is changed, and the electrostatic capacitance between the stationary electrode 16 and the membrane 20 is accordingly changed. The change in the electrostatic capacitance changes the output voltage Vout of the inverting amplifier circuit 30. Thus, the pressure acting on the pressure receiving surface 20a of the membrane 20 can be calculated in accordance with the output voltage Vout of the inverting amplifier circuit 30.

The inverting amplifier circuit 30 may be integrated into the pressure sensor 10 or provided at a substrate at which the pressure sensor 10 is disposed.

In this circuit configuration, the shield electrode 24 reduces effects of the electrostatic capacitance (parasitic capacitance) of the side-wall portion 18, that is, effects on the sensing performance of the pressure sensor 10.

Specifically, the electrostatic capacitance of the side-wall portion 18 exists in parallel with the electrostatic capacitance between the stationary electrode 16 and the membrane 20. Because the side-wall portion 18 is in contact with the surrounding environment around the pressure sensor 10, the electrostatic capacitance of the side-wall portion 18 easily changes as the surrounding environment changes. Changes in the electrostatic capacitance of the side-wall portion 18 affect the electrostatic capacitance between the stationary electrode 16 and the membrane 20. As a result, the sensing performance of the pressure sensor 10 relating to the electrostatic capacitance between the stationary electrode 16 and the membrane 20, which includes the sensor sensitivity and the linearity of changes in electrostatic capacitance corresponding to changes in pressure, is affected.

To overcome this problem, the grounded shield electrode 24 is provided in the side-wall portion 18. As a result, changes in the electrostatic capacitance of the side-wall portion 18 are reduced or prevented, which improves the sensor sensitivity of the pressure sensor 10 and improves the linearity of changes in electrostatic capacitance corresponding to changes in pressure.

However, when the shield electrode 24 is provided in the side-wall portion 18, the power consumption of the pressure sensor 10 is increased.

Specifically, as illustrated in FIG. 4, an electrostatic capacitance C1 is generated between the stationary electrode 16 and the membrane 20, and an electrostatic capacitance C2 is also generated between the shield electrode 24 and the membrane 20. Thus, the current supplied by the power supply 36 flows to the electrostatic capacitance C1 and also to the electrostatic capacitance C2. This means that a portion of electric power supplied by the power supply 36 to the pressure sensor 10 is consumed to charge the electrostatic capacitance C2 without being used for sensing.

To reduce electric power consumed by the electrostatic capacitance C2, as illustrated in FIG. 3, a distance L1 between the stationary electrode 16 and the membrane 20 is less than a distance L2 between the shield electrode 24 and the membrane 20 in the pressure sensor 10.

For this structure, in the first preferred embodiment, a surface 20c (that is, a surface opposite to the pressure receiving surface 20a) of the membrane 20 toward the base substrate has a multi-tier structure as illustrated in FIG. 3. Specifically, the multi-tier surface 20c of the membrane 20 includes a first tier 20d facing the stationary electrode 16 and a second tier 20e supported by the side-wall portion 18. The second tier 20e is positioned around the first tier 20d when viewed in the direction (Z-axis direction) in which the stationary electrode 16 and the membrane 20 face each other. The second tier 20e is farther from the base substrate 12 than the first tier 20d. The first tier 20d is rectangular or substantially rectangular when viewed in the direction (Z-axis direction) in which the stationary electrode 16 and the membrane 20 face each other.

With the multi-tier surface 20c of the membrane 20, the distance L1 between the stationary electrode 16 and the membrane (specifically the first tier 20d) is less than the distance L2 between the shield electrode 24 and the membrane 20 (specifically the second tier 20e). Thus, in comparison to the case in which the distance L1 is the same or substantially the same as the distance L2, the electrostatic capacitance C1 between the stationary electrode 16 and the membrane 20 is larger than the electrostatic capacitance C2 between the shield electrode 24 and the membrane 20. Accordingly, the amount of current flowing to the electrostatic capacitance C2 from the power supply 36 is less than if the distance L1 is the same or substantially the same as the distance L2, whereas the amount of current flowing to the electrostatic capacitance C1 is more than if the distance L1 is the same or substantially the same as the distance L2. As a result, the electrostatic capacitance C2 between the shield electrode 24 and the membrane 20 consumes less electric power than if the distance L1 is the same or substantially the same as the distance L2. This improves the sensor sensitivity of the pressure sensor 10.

According to the first preferred embodiment described above, the capacitance pressure sensor 10 including the side-wall portion 18 supporting the membrane 20 and including the shield electrode 24 can reduce electric power consumed by the electrostatic capacitance C2 between the shield electrode 24 and the membrane 20 without degrading the sensor sensitivity.

Second Preferred Embodiment

A second preferred embodiment of the present invention is an improvement to the first preferred embodiment described above. Thus, regarding a pressure sensor according to the second preferred embodiment, elements identical or substantially identical to the elements of the pressure sensor 10 according to the first preferred embodiment described above are assigned the same reference characters. The pressure sensor according to the second preferred embodiment will be described with particular emphasis on points different from the first preferred embodiment.

Figure 5:
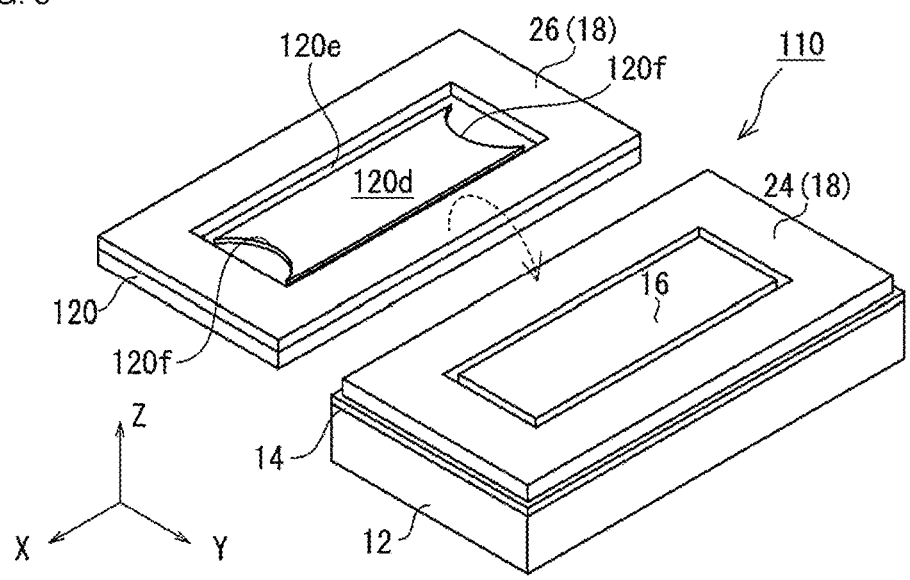
FIG. 5 is an exploded perspective view of a pressure sensor according to a second preferred embodiment of the present invention.
Figure 6:
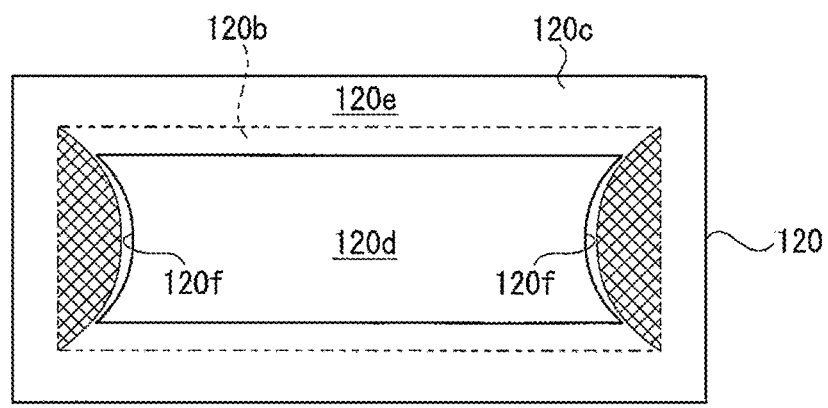
FIG. 6 illustrates a surface of a membrane toward a base substrate in the pressure sensor according to the second preferred embodiment of the present invention.

FIG. 5 is an exploded perspective view of the pressure sensor according to the second preferred embodiment of the present invention. FIG. 6 illustrates a surface of a membrane toward a base substrate in the pressure sensor according to the second preferred embodiment of the present invention.

As illustrated in FIG. 2, in the case of the pressure sensor 10 of the first preferred embodiment described above, the first tier 20d of the membrane 20 is rectangular or substantially rectangular when viewed in the direction (Z-axis direction) in which the stationary electrode 16 and the membrane 20 face each other. By contrast, as illustrated in FIGS. 5 and 6, a first tier 120d of a membrane 120 of a pressure sensor 110 according to the second preferred embodiment is narrowed in a longitudinal direction (X-axis direction). In other words, the first tier 120d includes narrow portions 120f on both sides in the longitudinal direction in the direction in which the stationary electrode 16 and the membrane 120 face each other (when viewed in the Z-axis direction).

As illustrated in FIG. 5, in the pressure sensor 110 according to the second preferred embodiment, the ratio of the longitudinal direction (X-axis direction) to a transverse direction (Y-axis direction) is greater than the ratio in the pressure sensor 10 of the first preferred embodiment described above. In the case of the pressure sensor 110 with such a structure, a diaphragm portion 120b of the membrane 120 is likely to be partially deformed when external force is applied. For example, when the pressure sensor 110 is embedded in a resin package to be protected in the state in which the diaphragm portion 120b is exposed to the outside, compressive stress as an external force is continuously applied to the pressure sensor 110 as the resin package solidifies (or contracts). In this case, as indicated by cross-hatching in FIG. 6, both end portions of the diaphragm portion 120b in the longitudinal direction are maintained in a deformed state. The degree and shape of this deformation vary among the manufactured individual pressure sensors 110. As a result, among the pressure sensors 110, the distance between the stationary electrode 16 and each of both end portions of the diaphragm portion 120b varies, which results in variations in the sensing performance.

To overcome this problem, as illustrated in FIG. 6, the first tier 120d has a shape narrowed in the longitudinal direction (X-axis direction) to avoid both end portions (cross-hatching), at which the distance to the stationary electrode 16 is likely to vary (the range of variations exceeds acceptable limits), of the diaphragm portion 120b in the longitudinal direction. This reduces deformation of the first tier 120d that forms the electrostatic capacitance C1 with the stationary electrode 16. As a result, it is possible to reduce variations in the sensing performance among the pressure sensors 110.

Similarly to the first preferred embodiment, the second preferred embodiment as described above can also reduce electric power consumed by the electrostatic capacitance between the shield electrode 24 and the membrane 20 without degrading the sensor sensitivity.

Third Preferred Embodiment

In a third preferred embodiment of the present invention, unlike the structure of the first preferred embodiment described above, the distance between a stationary electrode and a membrane is less than the distance between a shield electrode and the membrane. Regarding a pressure sensor according to the third preferred embodiment, elements identical or substantially identical to the elements of the pressure sensor 10 according to the first preferred embodiment described above are assigned the same reference characters. The pressure sensor according to the third preferred embodiment will be described with particular emphasis on points different from the first preferred embodiment.

Figure 7:
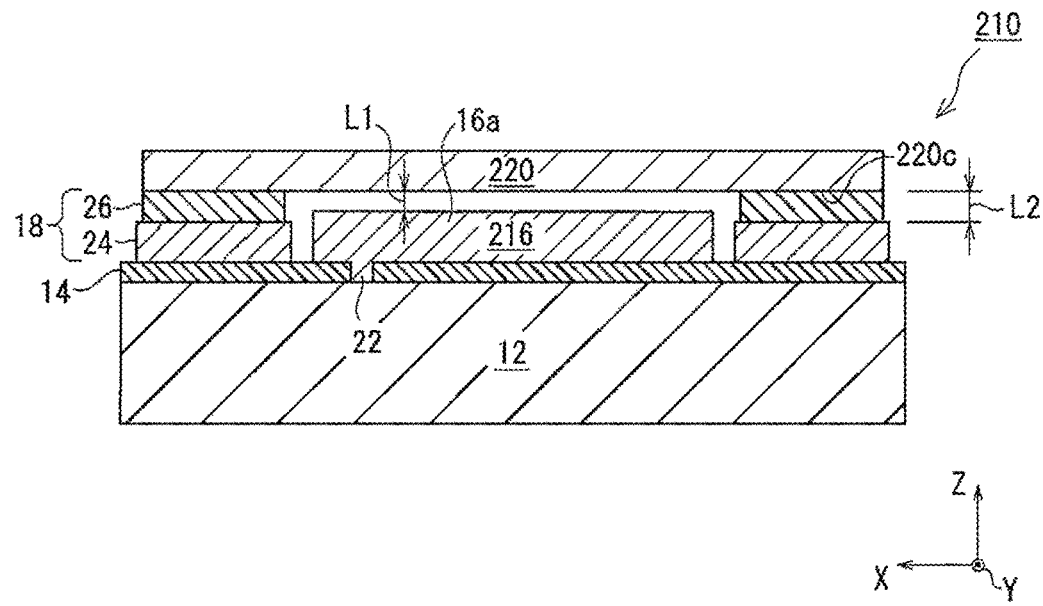
FIG. 7 is a sectional view of a pressure sensor according to a third preferred embodiment of the present invention.

FIG. 7 is a sectional view of the pressure sensor according to the third preferred embodiment of the present invention.

As illustrated in FIG. 7, a distance L1 between a stationary electrode 216 and a membrane 220 is less than a distance L2 between the shield electrode 24 and the membrane 220 in the pressure sensor 210.

Specifically, in the third preferred embodiment, a surface 220c of the membrane 220 toward the base substrate 12 does not have a multi-tier structure, but a single-plane structure unlike the first preferred embodiment. Instead, at least a middle portion of the stationary electrode 216 is thicker than the shield electrode 24. As a result, the distance L1 between the stationary electrode 216 and the membrane 220 is less than the distance L2 between the shield electrode 24 and the membrane 220.

Similarly to the first preferred embodiment, the third preferred embodiment as described above can also reduce electric power consumed by the electrostatic capacitance between the shield electrode 24 and the membrane 220 without degrading the sensor sensitivity.

Although the present invention has been described above with reference to the first to third preferred embodiments, preferred embodiments of the present invention are not limited to these preferred embodiments.

For example, in the case of the first preferred embodiment described above, the surface 20c of the membrane 20 toward the base substrate 12 has a two-tier structure including the first tier 20d and the second tier 20e as illustrated in FIG. 3. However, preferred embodiments of the present invention are not limited to this example.

Figure 8:
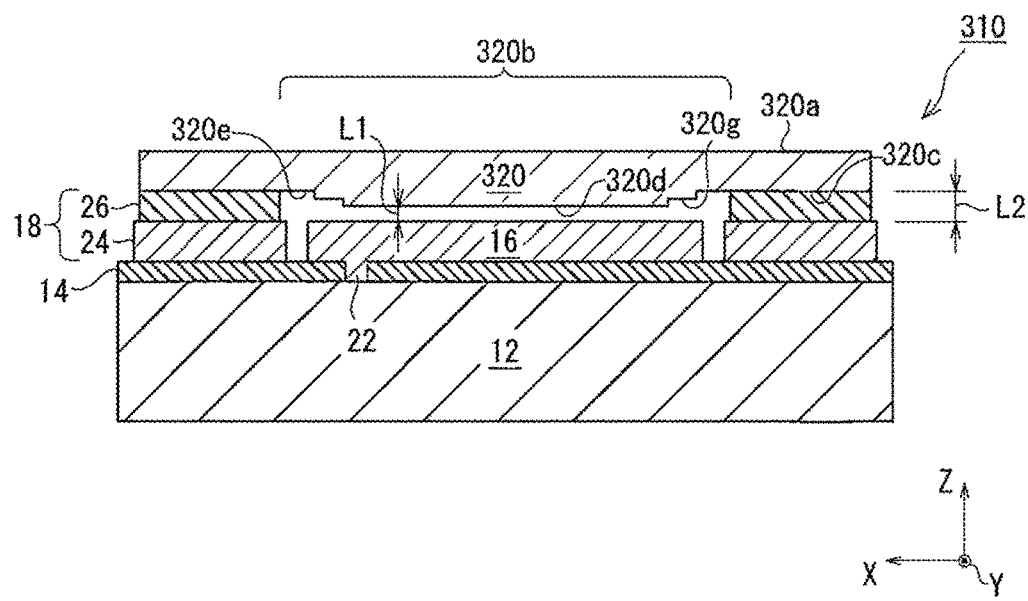
FIG. 8 is a sectional view of a pressure sensor according to a preferred embodiment of the present invention.

FIG. 8 is a sectional view of a pressure sensor according to another preferred embodiment of the present invention.

As illustrated in FIG. 8, in a pressure sensor 310 according to the present preferred embodiment, a surface 320c of a membrane 320 toward the base substrate 12 has a multi-tier structure including a first tier 320d, a second tier 320e, and a third tier 320g. When viewed in the direction (Z-axis direction) in which the stationary electrode 16 and the membrane 320 face each other, the third tier 320g is provided around the first tier 320d between the first tier 320d and the second tier 320e. The first tier 320d faces a middle portion of the stationary electrode 16. The third tier 320g faces an outer periphery portion of the stationary electrode 16. The second tier 320e is supported by the side-wall portion 18. Among the first to third tiers 320d, 320e, and 320g, the first tier 320d is closest to the base substrate 12, whereas the second tier 320e is farthest from the base substrate 12.

Similarly to the first preferred embodiment, the present preferred embodiment with such a structure can also reduce electric power consumed by the electrostatic capacitance between the shield electrode 24 and the membrane 320 without degrading the sensor sensitivity.

Regarding the multi-tier structure of the surface of the membrane toward the base substrate, in the case of the first preferred embodiment described above, the first and second tiers are joined together by a wall surface perpendicular or substantially perpendicular to the first and second tiers. Instead of this, the two tiers may be joined together by a sloping surface.

For example, in the case of the second preferred embodiment, the first tier 120*d* of the membrane 120 is narrowed in the longitudinal direction (X-axis direction) as illustrated in FIG. 6. However, the external force continuously applied to the pressure sensor to maintain deformation of a portion of the diaphragm portion of the membrane varies in accordance with how the pressure sensor is used.

Figure 9:
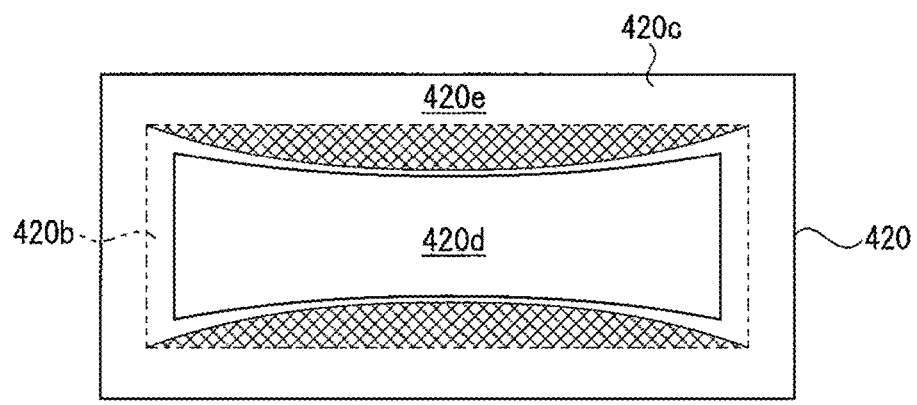
FIG. 9 illustrates a surface of a membrane toward a base substrate in a pressure sensor according to a preferred embodiment of the present invention.
Figure 10:
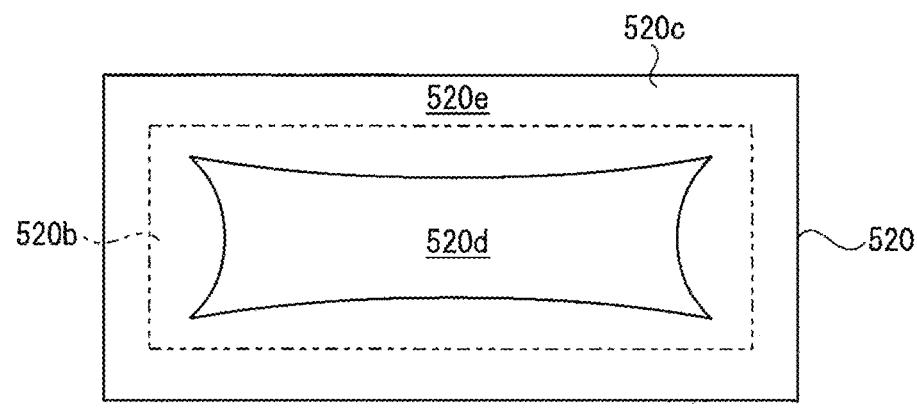
FIG. 10 illustrates a surface of a membrane toward a base substrate in a pressure sensor according to a preferred embodiment of the present invention.

FIG. 9 illustrates a surface of a membrane toward a base substrate in a pressure sensor according to a preferred embodiment of the present invention. FIG. 10 illustrates a surface of a membrane toward a base substrate in a pressure sensor according to a preferred embodiment of the present invention.

As illustrated in FIG. 9, a first tier 420*d* of a membrane 420 of the pressure sensor according to the present preferred embodiment is narrowed in the transverse direction (Y-axis direction). This structure is used when external force is continuously applied to the pressure sensor to maintain deformation of both end portions (cross-hatching portions) of a diaphragm portion 420*b* of the membrane 420 in the transverse direction.

As illustrated in FIG. 10, a first tier 520*d* of a membrane 520 of the pressure sensor according to a preferred embodiment of the present invention is narrowed in both the longitudinal direction (X-axis direction) and the transverse direction (Y-axis direction). This structure is used when external force is continuously applied to the pressure sensor to maintain deformation of both end portions in the longitudinal direction and both end portions in the transverse direction of a diaphragm portion 520*b* of the membrane 520 in the transverse direction.

In the case of the first preferred embodiment described above, the pressure sensor 10 can measure pressure until the pressure brings the membrane 20 into contact with the stationary electrode 16. However, preferred embodiments of the present invention are not limited to this example.

For example, a dielectric layer may be provided on a surface of the stationary electrode facing the membrane. In this case, as the pressure acting on the membrane increases, the membrane approaches the dielectric layer to contact the dielectric layer. After the membrane contacts the dielectric layer, as the pressure increases, the area of the membrane in contact with the dielectric layer increases. Before the membrane contacts the dielectric layer, as the distance between the membrane and the stationary electrode shortens, the electrostatic capacitance between the membrane and the stationary electrode increases. After the membrane contacts the dielectric layer, as the area contacting the dielectric layer expands, the electrostatic capacitance increases. In accordance with such two-stage changes in electrostatic capacitance, the pressure acting on the membrane is measured (calculated). Such a pressure sensor is referred to as a touch mode pressure sensor.

A pressure sensor according to a preferred embodiment of the present invention includes a base substrate, a first insulating layer provided at the base substrate, a stationary electrode provided at the first insulating layer, a side-wall portion provided around the stationary electrode at the first insulating layer, and a membrane having electrical conductivity, facing the stationary electrode across a space, and being supported by the side-wall portion. The side-wall portion includes a shield electrode disposed on the first insulating layer and a second insulating layer disposed on the shield electrode. The distance between the stationary electrode and the membrane is less than the distance between the shield electrode and the membrane.

The present invention has been described with reference to multiple preferred embodiments, but it should be apparent to those skilled in the art that further preferred embodiments of the present invention can be made by entirely or partially combining at least one preferred embodiment with another preferred embodiment.

Preferred embodiments of the present invention are applicable to a capacitance pressure sensor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A pressure sensor comprising:
a base substrate;
a first insulating layer at the base substrate;
a stationary electrode at the first insulating layer;
a side-wall portion provided around the stationary electrode at the first insulating layer; and
a membrane having electrical conductivity, facing the stationary electrode across a space, supported by the side-wall portion; wherein
the side-wall portion includes a shield electrode on the first insulating layer and a second insulating layer on the shield electrode; and
a distance between the stationary electrode and the membrane is less than a distance between the shield electrode and the membrane.

2. The pressure sensor according to claim 1, wherein
a surface of the membrane toward the base substrate has a multi-tier structure including at least a first tier facing the stationary electrode and a second tier supported by the side-wall portion and provided around the first tier when viewed in a direction in which the stationary electrode and the membrane face each other; and
the second tier is farther from the base substrate than the first tier.

3. The pressure sensor according to claim 2, wherein
the side-wall portion has a rectangular frame outer shape including a longitudinal direction and a transverse direction when viewed in the direction in which the stationary electrode and the membrane face each other; and
the first tier of the membrane includes a narrowed portion in at least one of the longitudinal direction and the transverse direction when viewed in the direction in which the stationary electrode and the membrane face each other.

4. The pressure sensor according to claim 1, wherein at least a middle portion of the stationary electrode is thicker than the shield electrode.

5. The pressure sensor according to claim 1, wherein a dielectric layer is provided on a surface of the stationary electrode facing the membrane.

6. The pressure sensor according to claim 1, wherein the base substrate is made of silicon.

7. The pressure sensor according to claim 1, wherein the first insulating layer is a silicon oxide film.

8. The pressure sensor according to claim 1, wherein the stationary electrode is made of conductive polysilicon.

9. The pressure sensor according to claim 1, wherein the membrane is made of conductive silicon.

10. The pressure sensor according to claim 1, wherein the shield electrode is made of a conductive polysilicon.

11. The pressure sensor according to claim 1, wherein a thickness of the stationary electrode is the same as a thickness of the shield electrode.

12. The pressure sensor according to claim 1, wherein the second insulating layer is a silicon oxide film.

\* \* \* \* \*